(12) United States Patent
Hsieh et al.

(10) Patent No.: US 7,135,783 B2
(45) Date of Patent: Nov. 14, 2006

(54) CONTACT ETCHING UTILIZING PARTIALLY RECESSED HARD MASK

(75) Inventors: Wen-Kuei Hsieh, Tainan County (TW); Hui-Min Mao, Taipei (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 113 days.

(21) Appl. No.: 10/923,585

(22) Filed: Aug. 20, 2004

(65) Prior Publication Data
US 2005/0275111 A1 Dec. 15, 2005

(30) Foreign Application Priority Data
Jun. 9, 2004 (TW) ................. 93116521 A

(51) Int. Cl.
H01L 23/544 (2006.01)
H01L 23/48 (2006.01)
H01L 23/52 (2006.01)

(52) U.S. Cl. .............. 257/797; 257/758; 257/774; 257/750

(58) Field of Classification Search ............... 257/797, 257/774, 758
See application file for complete search history.

(56) References Cited

U.S. PATENT DOCUMENTS

2003/0098509 A1 * 5/2003 Kamiya et al. .............. 257/758
2003/0109113 A1 * 6/2003 Wen et al. .................. 438/401

* cited by examiner

Primary Examiner—Nitin Parekh
(74) Attorney, Agent, or Firm—Quintero Law Office

(57) ABSTRACT

A method for forming contact holes using a partially recessed hard mask. A substrate with a device region and an alignment region having an opening therein, acting as an alignment mark, is provided. A dielectric layer is formed overlying the substrate and fills the opening. A polysilicon layer is formed on the dielectric layer, with over the opening on the alignment region comprising a recessed region and on the device region comprising a plurality of holes therein to expose the underlying dielectric layer. The exposed dielectric layer on the device region is etched to form contact holes therein.

7 Claims, 4 Drawing Sheets

CONTACT ETCHING UTILIZING PARTIALLY RECESSED HARD MASK

BACKGROUND

The present invention relates to a semiconductor process and in particular to fabrication of a semiconductor device using a partially recessed hard mask.

The increasing demand for highly integrated and high-performance semiconductor devices has fueled the need for advances in integrated circuit manufacturing technology. To produce an integrated circuit with high integration density, semiconductor device and interconnect sizes must be reduced. Lithography and etching form trenches and contact holes in the dielectric layer prior to formation of the interconnects. Thereafter, the trenches and contact holes are filled with a metal layer, followed by polishing to complete the fabrication. This is a typical damascene process in semiconductor manufacturing technology. In a common etching technique used to form openings, such as trenches or contact holes, in a target layer on a substrate, a photoresist pattern is formed on the target layer serving as an etch mask. Since the thickness of the photoresist pattern can dictate the etching rate, the photoresist pattern must be thick if the contact holes are to be very small.

A photoresist layer having a thickness of 3000 Å or more, however, is not sensitive to the light used for lithography. That is, it is difficult to form a contact hole with a small critical dimension using a photoresist layer as an etch mask. Accordingly, the fabrication of a contact hole with small critical dimension using a polysilicon layer as an etch mask has been widely employed.

FIG. 1 is a cross-section of a conventional semiconductor device fabricated using a single polysilicon hard mask. The semiconductor device comprises a substrate 100, an interlayer dielectric (ILD) layer 112, a polysilicon hard mask 114, a barrier layer 116, and a metal layer 118. The substrate 100 comprises a device region 10 and an alignment region 20, in which the device region 10 has a plurality of gate structures 107 formed thereon and the alignment region 20 has an opening 101 formed in the substrate 100 serving as an alignment mark (AM). The gate structure 107 comprises a gate dielectric layer 102, a gate electrode 104, and a gate spacer 106. The ILD layer 112 overlies the substrate 100, with the portion thereof over the device region 10 comprising a bit line contact hole ($C_B$) 113a, a gate contact hole ($C_G$) 113b, and a substrate contact hole ($C_S$) 113c therein. The portion of ILD layer 112 on the alignment region 20 has an opening therein to expose the opening 101. The polysilicon hard mask 114 is disposed on the ILD layer 112 and the portion thereof over the device region 10 has a plurality of holes to expose the bit line contact hole 113a, the gate contact hole 113b, and the substrate contact hole 113c and the portion over the alignment region 20 has an opening therein to expose the opening (alignment mark) 101. The barrier layer 116 comprising titanium nitride is conformably disposed on the polysilicon hard mask 114 and the inner surfaces of the contact holes 113a, 113b, and 113c and the opening 101. The metal layer 118, such as a tungsten layer, is conformably formed on the barrier layer 116 and the opening 101 and fills the contact holes 113a, 113b, and 113c.

During the fabrication of the semiconductor device, the alignment mark 101 on the alignment region 20 may fail due to light strongly reflected from the thicker polysilicon hard mask 114. That is, it is difficult to define the contact holes 113a, 113b, and 113c during lithography. In order to solve this problem, the polysilicon hard mask 114 over the alignment mark 101 must be removed prior to definition of the contact holes 113a, 113b, and 113c. As a result, a deeper and wider opening is formed by removing the ILD layer 112 over the alignment mark 101 during definition of the contact holes 113a, 113b, and 113c. As the subsequent metal layer 118 is filled for the fabrication of contact plugs, the deeper and wider opening cannot be completely filled with the metal layer 118. The metal layer 118, however, is conformably formed on the inner surface of the opening. A dishing effect thus occurs during planarization by chemical mechanical polishing (CMP). As a result, the metal layer 118 adjacent to the alignment mark 118 is disconnected, as depicted by the arrows 119 shown in FIG. 1, thus reducing device reliability.

SUMMARY

An embodiment of the invention provides a method for forming contact holes using a partially recessed hard mask. A substrate with a device region and an alignment region comprising an opening therein serving as an alignment mark is provided. A dielectric layer is formed overlying the substrate and fills the opening. A polysilicon pattern layer is formed overlying the dielectric layer serving as the hard mask, in which the polysilicon pattern layer comprises a recessed region over the opening and a plurality of holes therein on the device region to expose the underlying dielectric layer. The exposed dielectric layer is etched using the polysilicon pattern layer as an etch mask, to form the plurality of contact holes in the dielectric layer on the device region.

The polysilicon pattern layer has a thickness of about 700 to 1000 Å and the recessed region a depth of about 300 to 500 Å. Moreover, the contact hole may comprise a bit line contact hole, a gate contact hole, or a substrate contact hole.

An embodiment of the invention also provides a semiconductor device fabricated using a partially recessed hard mask. The device comprises a substrate, a dielectric layer, a polysilicon pattern layer, a barrier layer, and a metal layer. The substrate has a device region and an alignment region comprising an opening therein serving as an alignment mark. The dielectric layer overlies the substrate and fills the opening, with the dielectric layer on the device region comprising a plurality of contact holes therein. The polysilicon pattern layer is disposed on the dielectric layer serving as the hard mask, with that over the opening on the alignment region having a recessed region and that on the device region having a plurality of holes therein to expose the contact holes formed in the underlying dielectric layer. The barrier layer is conformably disposed on the polysilicon pattern layer and the inner surfaces of the contact holes and the recessed region. The metal layer is disposed on the barrier layer and fills the contact holes and the recessed region.

The polysilicon pattern layer has a thickness of about 700 to 1000 Å and the recessed region a depth of about 300 to 500 Å. Moreover, the contact hole may comprise a bit line contact hole, a gate contact hole, or a substrate contact hole.

BRIEF DESCRIPTION OF THE DRAWINGS

Embodiments of the invention will become more fully understood from the detailed description given hereinbelow and the accompanying drawings, given by way of illustration only and thus not intended to be limitative of the invention.

DETAILED DESCRIPTION

Figure 1:
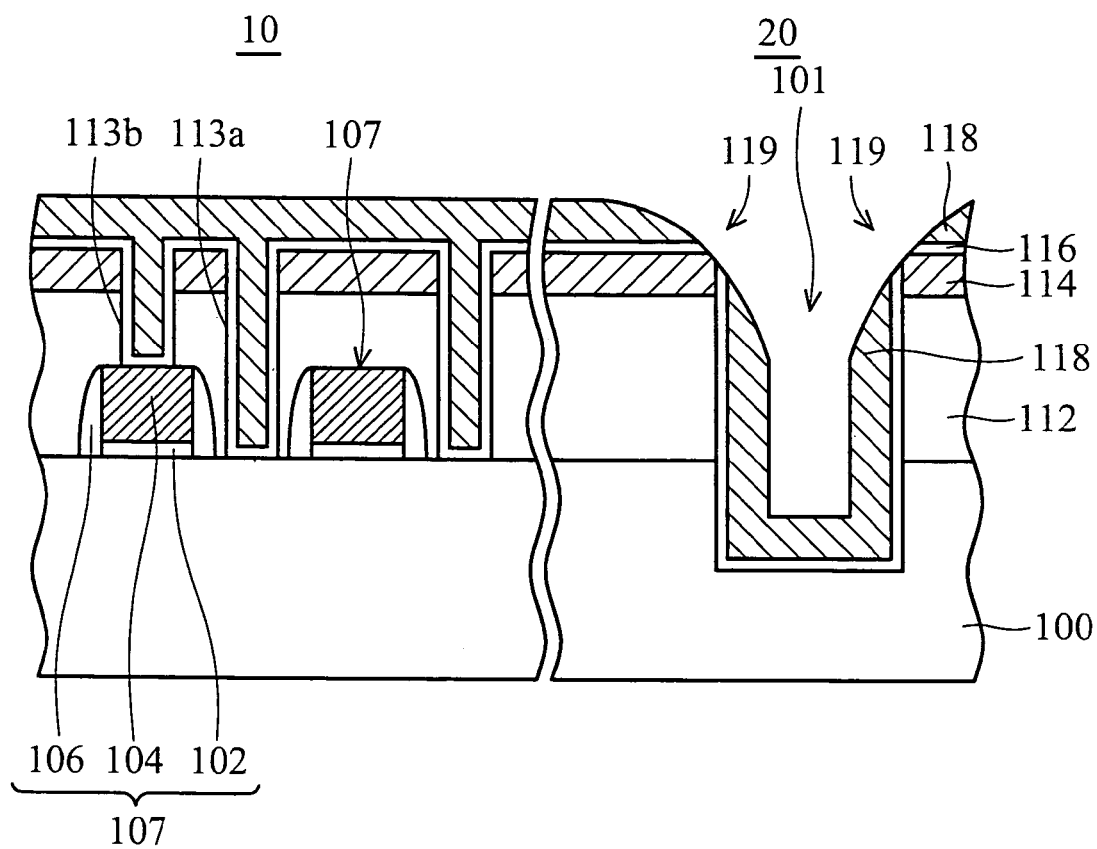
FIG. 1 is a cross-section of a conventional semiconductor device fabricated using a single polysilicon hard mask.
Figure 2A:
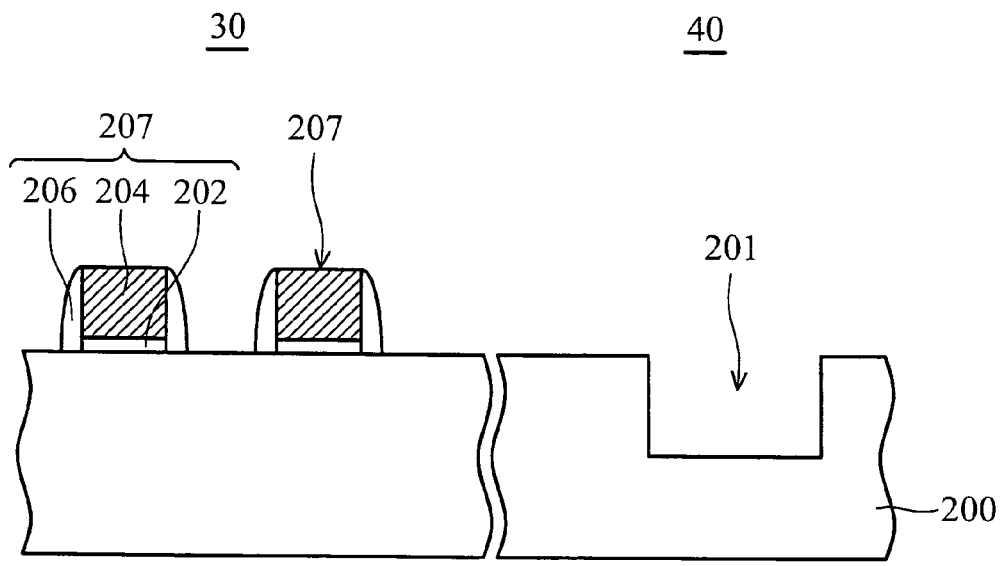
FIGS. 2A to 2E are cross-sections of a method for forming contact plugs using a partially recessed hard mask of an embodiment of the invention.

First, as shown in FIG. 2A, a substrate 200 for the fabrication of a semiconductor memory device is provided. The substrate 200 may be, for example, a silicon substrate. In this embodiment, the substrate 200 has a device region 30, such as an array region or peripheral circuit region, and an alignment region 40. The device region 30 has a plurality of gate structures 207 thereon and the alignment region 40 an opening 201 therein serving as an alignment mark (AM). Moreover, the gate structure 207 comprises a gate dielectric layer 202, a gate electrode 204, and a gate spacer 206.

Figure 2B:
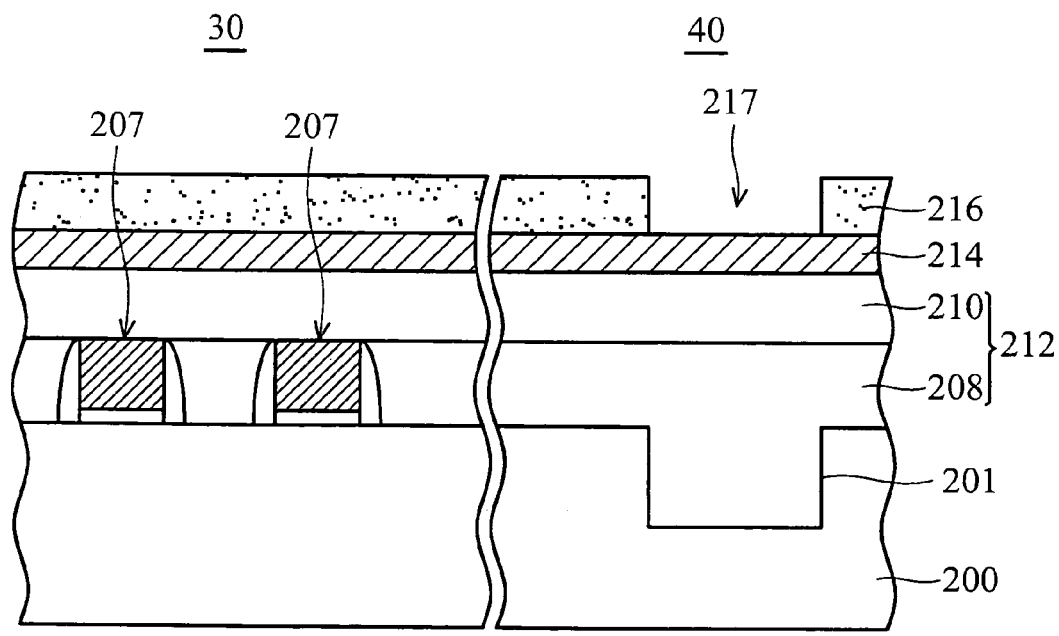

As shown in FIG. 2B, a dielectric layer 212 is deposited overlying the substrate 200 serving as an interlayer dielectric (ILD) layer, covering the gate structures 207 on the device region 30 and filling the opening 201 on the alignment region 40. The ILD layer 212 may be a single layer or multiple layers, and can comprise, for example, a borophosphosilicate glass (BPSG) layer and a tetraethyl orthosilicate (TOES) oxide layer, and can be formed by the following steps. First, a BPSG layer 208 blanketly covers the gate structures 207 on the device region 30 and fills the opening 201 on the alignment region 40. Excess BPSG layer 208 over the gate structures 207 is removed by chemical mechanical polishing (CMP). Thereafter, a TEOS oxide layer 210 is formed on the polished BPSG layer 208 by conventional deposition, such as chemical vapor deposition (CVD).

Next, a polysilicon layer 214 is deposited overlying the ILD layer 212 serving as a hard mask for subsequent etching. The polysilicon layer 214 may be formed by conventional deposition, such as CVD. Moreover, the polysilicon layer 214 has a thickness of about 700 to 1000 Å. Next, a photoresist pattern layer 216 is formed on the polysilicon layer 214, which has an opening 217 therein to expose the polysilicon layer 214 over the opening 201 on the alignment region 40.

Figure 2C:
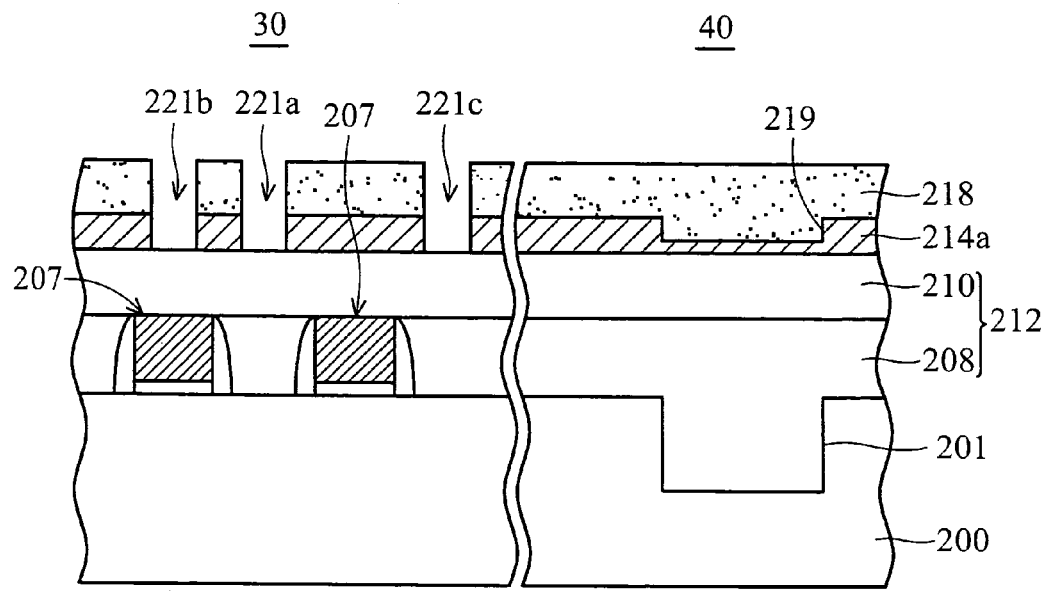

Next, in FIG. 2C, the polysilicon layer 214 overlying the ILD layer 212 is patterned to form a polysilicon pattern layer 214a which has a recessed region 219 over the opening 201 on the alignment region 40 and a plurality of holes 221a, 221b, and 221c on the device region 30 to expose the underlying ILD layer 212. The polysilicon pattern layer 214a may be formed by following steps. First, the polysilicon layer 214 under the opening 217 is partially etched using the photoresist pattern layer 216 shown in FIG. 2B as an etch mask, to form the recessed region 219 over the opening (alignment mark) 201 which has a depth of about 300 to 500 Å. The photoresist pattern layer 216, no longer needed, is subsequently removed. Next, another photoresist pattern layer 218 is formed on the polysilicon pattern layer 214a, in which the photoresist pattern layer 218 has a plurality of holes 221a, 221b, and 221c therein on the device region 30. Thereafter, the polysilicon pattern layer 214a is etched using the photoresist pattern layer 218 as an etch mask, to transfer the plurality of holes 221a, 221b, and 221c therein and expose the underlying ILD layer 212 for the subsequent definition of contact holes. The hole 221a can be used for definition of a bit line contact hole ($C_B$), hole 221b for definition of a gate contact hole ($C_G$), and hole 221c for definition of a substrate contact hole ($C_S$).

As mentioned above, if the polysilicon hard mask is too thick, the alignment mark for subsequent lithography may fail due to light strongly reflected from the hard mask. Conversely, if the polysilicon hard mask is not thick enough, the subsequent etching may suffer. However, in this embodiment, the thickness of the polysilicon hard mask 214a over the alignment mark 201 is reduced due to the formation of the recessed region 219. Accordingly, the strongly reflected light is prevented during subsequent lithography for the definition of contact holes.

Figure 2D:
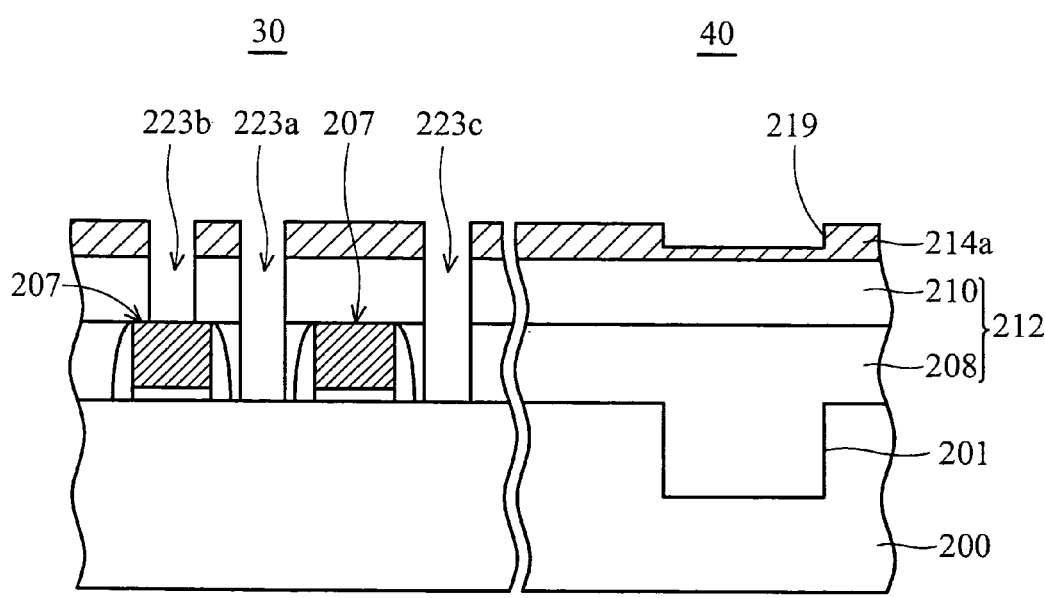

Next, in FIG. 2D, after removal of the photoresist pattern layer 218, the exposed ILD layer 212 on the device region 30 is etched using the polysilicon pattern layer 214a as an etch mask to form a bit line contact hole 223a, a gate contact hole 223b, and a substrate contact hole 223c. The ILD layer 212 over and in the alignment mark 201 is not etched due to the protection of the polysilicon pattern layer 214a thereon. As a result, the step height on the alignment region 40 can be reduced when the subsequent metal layer is deposited thereon.

Figure 2E:
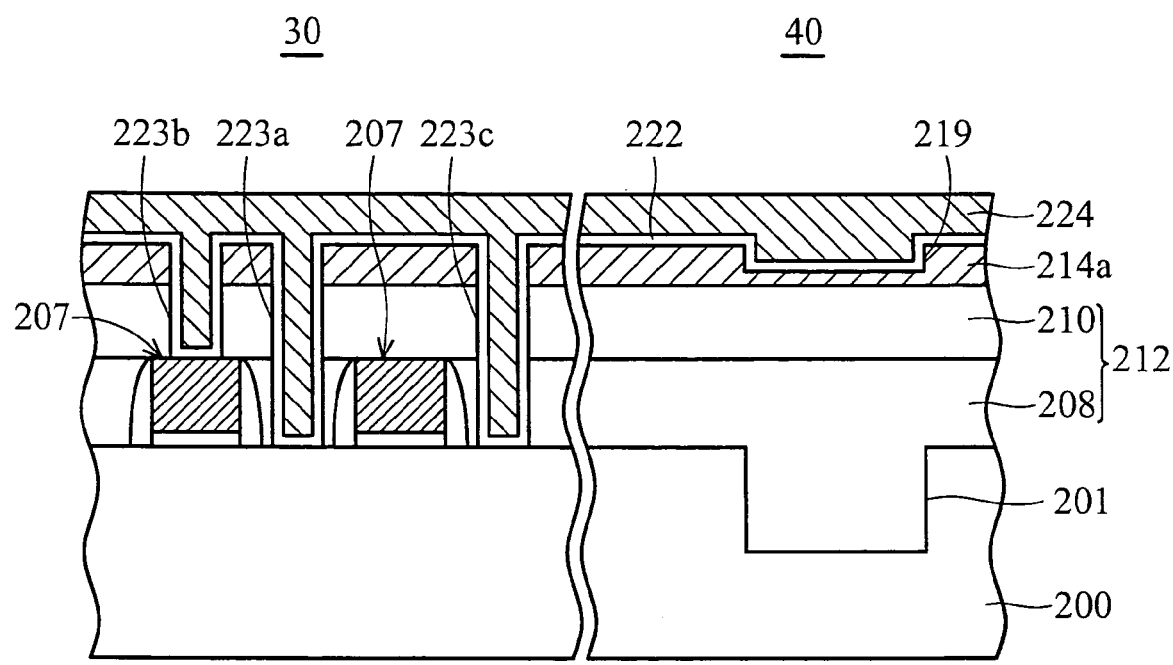

Finally, in FIG. 2E, a barrier layer 222 comprising, for example, titanium and titanium nitride, is conformably formed on the polysilicon pattern layer 214a and the inner surfaces of the contact holes 223a, 223b, 223c and the opening 219. Thereafter, a metal layer 224, such as a tungsten layer, is formed on the barrier layer 222, filling the contact holes 223a, 223b, 223c and the opening 219 to complete fabrication of the contact plugs. The metal layer 224 is subsequently planarized by CMP.

FIG. 2E also illustrates a semiconductor device fabricated using a partially recessed hard mask of an embodiment of the invention. The semiconductor device comprises a substrate 200, an ILD layer 212, a polysilicon pattern layer 214a, a barrier layer 222, and a metal layer 224. The substrate comprises a device region 30 and an alignment region 40, the device region 30 comprising a plurality of gate structures 207 thereon and the alignment region 40 an opening 201 therein serving as an alignment mark (AM). Moreover, the gate structure 207 comprises a gate dielectric layer 202, a gate electrode 204, and a gate spacer 206. The ILD layer 212 overlies the substrate 200 and fills the opening 201, the ILD layer 212 on the device region 30 comprising a bit line contact hole 223a, a gate contact hole 223b, and a substrate contact hole 223c therein. Moreover, the ILD layer 212 may comprise a borophosphosilicate glass (BPSG) layer and a tetraethyl orthosilicate (TOES) oxide layer. The polysilicon pattern layer 214a is disposed on the ILD layer 212 serving as the partially recessed hard mask, with over the opening (alignment mark) 201 on the alignment region 40 comprising a recessed region 219. Moreover, the polysilicon pattern layer 214a on the device region 30 comprises a plurality of holes therein to expose the bit line contact hole 223a, the gate contact hole 223b, and the substrate contact hole 223c in the ILD layer 212. The polysilicon pattern layer 214a has a thickness of about 700 to 1000 Å and the recessed region 219 a depth of about 300 to 500 Å. The barrier layer 222 comprising, for example, titanium and titanium nitride, is conformably disposed on the polysilicon pattern layer 214a and the inner surfaces of the contact holes 223a, 223b, and 223c and the recessed region 219. The metal layer 224, such as a tungsten layer, is disposed on the barrier layer 222 and fills the contact holes 223a, 223b, and 223c and the recessed region 219.

According to an embodiment of the invention, the thickness of the polysilicon pattern layer 214a over the alignment mark 201 may be reduced, eliminating strongly reflected light from the hard mask. Moreover, since the step height of the metal layer 224 on the alignment region 40 is reduced by the partially recessed hard mask 214*a*, disconnection of the metal layer 224 adjacent to the alignment mark 201 may be prevented after planarization.

While the invention has been described by way of example and in terms of preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A semiconductor device fabricated using a partially recessed hard mask, comprising:
    a substrate with a device region and an alignment region having an opening therein serving as an alignment mark;
    a dielectric layer overlying the substrate and filling the opening, wherein the dielectric layer on the device region has a plurality of contact holes therein;
    a polysilicon pattern layer disposed on the dielectric layer, acting as a hard mask, wherein the polysilicon pattern layer over the opening on the alignment region comprises a recessed region and the polysilicon pattern layer on the device region comprises a plurality of holes therein, exposing the contact holes underlying the dielectric layer;
    a barrier layer conformably disposed on the polysilicon pattern layer and the inner surfaces of the contact holes and the recessed region; and
    a metal layer disposed on the barrier layer and filling the contact holes and the recessed region.

2. The device as claimed in claim 1, wherein the dielectric layer comprises borophosphosilicate glass or tetraethyl orthosilicate oxide.

3. The device as claimed in claim 1, wherein the polysilicon pattern layer has a thickness of about 700 to 100 Å.

4. The device as claimed in claim 1, wherein the recessed region has a depth of about 300 to 500 Å.

5. The device as claimed in claim 1, wherein the contact hole comprises a bit line contact hole, a gate contact hole, or a substrate contact hole.

6. The device as claimed in claim 1, wherein the barrier layer comprises titanium and titanium nitride.

7. The device as claimed in claim 1, wherein the metal layer comprises tungsten.

* * * * *